(12) United States Patent
Nikitin

(10) Patent No.: US 11,689,212 B2
(45) Date of Patent: Jun. 27, 2023

(54) METHOD OF VERNIER DIGITAL-TO-ANALOG CONVERSION

(71) Applicant: Yury Alexandrovich Nikitin, Saint Petersburg (RU)

(72) Inventor: Yury Alexandrovich Nikitin, Saint Petersburg (RU)

( * ) Notice: Subject to any disclaimer, the term of this patent is extended or adjusted under 35 U.S.C. 154(b) by 10 days.

(21) Appl. No.: 17/439,607

(22) PCT Filed: Mar. 18, 2020

(86) PCT No.: PCT/RU2020/050050
§ 371 (c)(1),
(2) Date: Sep. 15, 2021

(87) PCT Pub. No.: WO2020/190177
PCT Pub. Date: Sep. 24, 2020

(65) Prior Publication Data
US 2022/0200621 A1 Jun. 23, 2022

(30) Foreign Application Priority Data
Mar. 18, 2019 (RU) ................................ 2019107698

(51) Int. Cl.
*H03M 1/68* (2006.01)
*H03M 1/66* (2006.01)

(52) U.S. Cl.
CPC ............... *H03M 1/68* (2013.01); *H03M 1/66* (2013.01); *H03M 1/661* (2013.01); *H03M 1/687* (2013.01)

(58) Field of Classification Search
CPC .......... H03M 1/68; H03M 1/661; H03M 1/66; H03M 1/687

(Continued)

(56) References Cited

U.S. PATENT DOCUMENTS

| 4,503,421 A | * | 3/1985 | Hareyama | ............... H03M 1/10 341/145 |
| 5,451,946 A | * | 9/1995 | Smith | ..................... H03M 1/68 341/145 |
| 2010/0183066 A1 | | 7/2010 | Chen et al. | |

OTHER PUBLICATIONS

Chen, Poki, et al., "FPGA Vernier Digital-to-Time Converter With 1.58 ps Resolution and 59.3 Minutes Operation Range", IEEE Transactions on Circuits and Systems-I: Regular Papers, IEEE, US, vol. 57, No. 6, Jun. 2010, pp. 1134-1142.

(Continued)

*Primary Examiner* — Khai M Nguyen
(74) *Attorney, Agent, or Firm* — Hoffmann & Baron, LLP

(57) ABSTRACT

A method of Vernier digital-to-analog conversion, the method including: performing conversion of a reference signal Y using a control code $X=M+a^{-\alpha}N$ with a length $\psi=\alpha+\beta$, wherein M is a control code with a length $\alpha$, including high-order bits of the control code X, and $a^{-\alpha}N$ is a control code with a length $\beta$, including lower-order bits of the control code X, wherein $\alpha\approx\beta$; performing digital multiplication of the lower-order $a^{-\alpha}N$ bits of the control code X by $a^{\alpha}$ times algebraic summing $\alpha$ of the high-order bits of the control code X and $\beta$ of the lower-order bits of $a^{-\alpha}N$ of the control code X being a result of multiplication by $a^{\alpha}$ times, according to formula $Q=M\pm N$, wherein N is a resulting digital code of the digital multiplication, and Q is a resulting digital code of $M\pm N$; converting the resulting digital code Q from a reference signal $Y_1$ to an analog signal $Z_1$, and converting the resulting digital code N from a reference signal $Y_2$ to an analog signal $Z_2$, wherein reference signals $Y_1$ and $Y_2$ are related by a ratio: $Y_2=Y_1(1\pm a^{-\alpha})$, wherein a is a base of number system, $\alpha$ is a number of bits of shifting the control code $a^{-\alpha}N$; and summing analog signals $Z_1$ and $Z_2$ to generate an analog output signal $Z_0$.

3 Claims, 3 Drawing Sheets

(58) Field of Classification Search
USPC .................................................. 341/144–145
See application file for complete search history.

(56) References Cited

OTHER PUBLICATIONS

Nuyts, Pieter A.J. et al., "Topology selection for high-precision Vernier digital-to-time converters in standard CMOS", AEU-International Journal of Electronics and Communications, Elsevier, Amsterdam, NL, vol. 67, No. 4, Apr. 2013, pp. 355-360.
International Search Report issued in International Application No. PCT/RU2020/050050 dated Sep. 4, 2020.
Written Opinion of the International Searching Authority issued in International Application No. PCT/RU2020/050050 dated Sep. 4, 2020.

* cited by examiner

METHOD OF VERNIER DIGITAL-TO-ANALOG CONVERSION

CROSS-REFERENCE TO RELATED APPLICATIONS

The present application is the U.S. National Phase of PCT/RU2020/050050, filed on 18 Mar. 2020, which claims priority to Russian Patent Application No. 2019107698, filed on 18 Mar. 2019, the entire contents of which are incorporated herein by reference.

BACKGROUND

Field

The invention relates to electrical signals conversion, in particular, to conversion of digital information to analog signal.

RELATED ART

Known are two main methods of the digital-to-analog conversion: a first method provides performing a unit reference signals summation, and a second method provides performing a summation of reference signals, having weights differing one from the other.

The first method provides a use of the only one reference quantity having a weight of 1 (one) quantum in the process of forming an output analog signal and using a binary control code (see Titze U., Schenk K. Semiconductor Circuit Engineering: Reference Manual. Translation from German. M. Mir, 1982.—512 s. Pages 444, FIG. 24.1 and page 245 FIG. 24.2).

The above-mentioned digital-to-analog converters (DACs) form the reference values corresponding to the values of the digits of the input control code X from the reference signal Y, which values are summed, and discrete values of the output analog value Z are formed.

A principle of the method of the digital-to-analog conversion can be presented in the view shown in FIG. 1.

Let's consider a parallel digital-to-analog converter (DAC) shown in FIG. 1 having an input of a single analog (reference) signal Y—current or voltage, digital control inputs X clocked in time with an interval t and an output of the analog signal Z—current or voltage, wherein the reference signal Y and the output signal Z can be the same (current or voltage at the input and current or voltage at the output), or different (voltage or current at the input—current or voltage at the output).

A conversion of the digital control code X into the output analog value Z is performed in one or several clock cycles of time t, i.e., in the extreme case, for one clock cycle, all bits of the control code X are converted into the analog value Z. Therefore, DAC_0 implementing this conversion method is called parallel.

We assume that the digital control code is positional and the number system with the base a is unprincipled—it can be decimal (a=10), binary (a=2), hexadecimal (a=16), or any other.

For example, the digital binary code of a number (code) X, normalized to one:

$$0 \leq X = \Sigma_{k=0}^{\psi-1} q_k \times a^{-k} < 1,$$

wherein $a=2$; $q_k \in [0,1]$; $\psi$—is the number of bits in the code X.

For a binary DAC, the output signal is determined as follows:

$$Z = hY(a_{k-1}2^{k-1} + a_{k-2}2^{k-2} + \ldots + a_0 2^0)$$

wherein Y is the reference signal; $q \in (a_0, a_1, \ldots, a_{k-1}) \equiv [0,1]$—coefficients of bits taking on values "0" or "1";

$k=0, \ldots \psi-1$—number of the bit;

h—factor of proportionality.

In the case of a digital decimal control code of the number X normalized to one:

$$0 \leq X = \Sigma_{k=0}^{\psi-1} q_k \times a^{-k} < 1,$$

wherein $a=10$; $q_k \in [0.1, \ldots, 9]$; $\psi$ is the number of decimal places in the code X.

In the digital-to-analog converters (DACs) the reference signals corresponding to the values of the digits of the input control code X are generated from the reference signal Y, these signals are summed, and discrete values of the output analog quantity Z are formed.

An internal content of the DAC_0 and an algorithm of the operation thereof (internal functioning) for further consideration are not of fundamental importance.

The analog signal Z at the output of DAC_0 is generated from the reference analog signal Y at the input by controlling the DAC_0 with a digital code X of length $\psi$ bits; the reference signal Y is the basis of the analogue measuring scale. The value of the step (quantization step) at the output of such a DAC_0 is $s=Y/(a^\psi-1)$.

In this case, $Z=Y \times X$ and the «classical» conversion $Z \Rightarrow X$ takes place, and the conversion accuracy is a linear function of the accuracy of the elementary electronic components of the DAC_0—resistive (capacitor) matrices, current (voltage) switches, etc., i.e., it is determined by the manufacturing technology of a particular DAC_0 microcircuit and the final accuracy (variation) of the nominal values of its internal elements.

In the considered conversion, both in the first and in the second method, errors arise due to the manufacture of DAC_0 elements. The main factors of element errors are:

technological variation of parameters (manufacturing accuracy);

the influence of environmental changes (mainly temperature)—temperature stability;

change in parameters over time (aging); and exposure to external and internal noise and interference.

Therefore, the conversion characteristics of real DAC_0 differ from ideal ones in the shape, value of the steps and location thereof relative to the coordinate axes.

To increase the conversion accuracy, one can make the internal structure of DAC_0 more complicated, increase accuracy and stability of parameters of elements used, but only within the limits of production capabilities.

The above-mentioned reasons, and this is, ultimately, the technological capabilities of production, limit the maximum achievable accuracy of the parallel DAC_0, which currently does not exceed 18 . . . 22 binary bits (bits) of the control code X.

Known is a method of digital-to-analog conversion, an example of realization of which is shown in FIG. 2, using an initial DAC_0 shown in FIG. 1 (see Titze U., Schenk K. Semiconductor Circuit Engineering: Reference Manual. Translation from German. M. Mir, 1982.—512 s. Pages 447, FIG. 24.7).

FIG. 2 shows: DAC_2 and DAC_4 with a reference signal Y and a clock signal t supplied to corresponding inputs DAC_2 and DAC_4, and a control code M of length $\alpha$ bits and a control code $a^{-\alpha}N$ of length $\beta$ bits respectively arrive at input control buses of DAC_2 and DAC_4. An output of DAC_4 is connected to an input of an attenuator 5, the output of the attenuator 5 is connected to a first input of a signal adder 3, the second input thereof is connected to an output of DAC_2. The resulting analog signal $Z_0$ is at the output of the signal adder 3.

According to this conversion method a digital control code $X=M+a^{-\alpha}N$ of length $\psi$ bits is divided into two control codes M and $a^{-\alpha}N$ (preferably half length, but not necessary): $\psi=\alpha+\beta$, where a is a number of the high-order bits of the control code X and $\beta$—is a number of the lower-order bits of the control code X. Both DACs are locked in the same moments of time t.

This conversion uses the only reference signal (measuring scale) Y as the above-mentioned prior art.

Lower-order bits $a^{-\alpha}N$ with length $\beta$ of a control code X are multiplied aa times in a digital multiplier, forming a control code N with length $\beta$ bits.

The first DAC_2 converts a control code M of length $\alpha$ bits to an analog signal $Z_1$, the second DAC_4 converts a control code N of length $\beta$ bits to an analog signal $Z_2$.

The value of a step (quantization step) at the output of DAC_2 is $s_1=Y/a^\alpha \gg Y/a^\psi$, and the value of a step (quantization step) at the output of DAC_4 is $s_2=Y/a^\beta \gg Y/a^\psi$. In the case $\alpha \approx \beta$, the steps $s_1 \approx s_2$.

In this case, changes of magnitude (amplitude) of the output signal $Z_1$ when changing a control code M normalized to unity from 0 to $(1-a^{-\alpha})$ at the output of DAC_2 will be equal to $Z_1=Y(1-a^{-\alpha})$, and an amplitude of the output signal $Z_2$ when changing a control code N normalized to unity from 0 to $(1-a^{-\beta})$ at the output of DAC_4 will be $Z_2=Y(1-a^{-\beta})$.

In order to reduce the step of the output analog signal $Z_0$ to the initial value $s=Y/a^\psi$, it is necessary to reduce the amplitude of the output analog signal $Z_2$ at the output of DAC_4 by $a^\alpha$ times using the analog attenuator 5 and to add a received signal $Z_3=Z_2/a^\alpha$ with the output signal $Z_1$ of DAC_2 (for which the step value $s_1=Y/a^\alpha$) in the signal adder 3.

At the output of the signal adder 3 (FIG. 2), the output signal $Z_0=Z_1+Z_3$ is obtained, the signal is variable from 0 to $Y(1-a^{-\psi})$ with the required quantization step $s=Y/(a^\psi)$.

The conversion accuracy of the reference signal Y into the analog value $Z_0$ will be the same as that of the prior art analog shown in FIG. 1, but the accuracy requirements for DAC_4 will be reduced by $a^\alpha$ times.

However, in the considered known method of digital-to-analog conversion, high accuracy of DAC_2 and of the analog attenuator 5 disposed between the output of DAC_4 and the input of the signal adder 3 should be provided.

The same stringent accuracy requirements are required to these two analog nodes of the structure shown in FIG. 2 as to the DAC_0 shown in FIG. 1. The accuracy of DAC_2 and the attenuator 5 will limit the resulting accuracy of the entire DAC shown in FIG. 2.

The conversion method implemented in the structure of the parallel DAC shown in FIG. 2 is accepted as a closest analog.

SUMMARY

Technical Problem

A technical result of the present invention is to increase a conversion accuracy of analog magnitude using digital processing of a control code.

Solution to Problem

The technical result is achieved in the proposed method of Vernier digital-to-analog conversion comprising: performing a conversion of a reference signal Y to an analog output signal $Z_0$ using a control code $X=M+a^{-\alpha}N$ with a length $\psi=\alpha+\beta$, wherein M is a control code with a length $\alpha$, including high-order bits of the control code X; $a^{-\alpha}N$ is a control code with a length $\beta$, including lower-order bits of the control code X wherein $\alpha \approx \beta$; performing two parallel conversions of an analog signal Z, wherein in the first conversion, a first analog signal $Z_1$ is proportional to the control code M with the length $\alpha$ bits, and in the second conversion, a second output analog signal $Z_2$ is proportional to the control code N with the length $\beta$ bits; output performing digital multiplication of the lower-order $a^{-\alpha}N$ bits of the control code X by $a^\alpha$ times prior to said parallel conversions, and summing the converted analog signals $Z_1$ and $Z_2$ to an output signal $Z_0$; wherein algebraic summing $\alpha$ of the high-order bits of the control code X and $\beta$ of the lower-order bits of $a^{-\alpha}N$ of the control code X being a result of multiplication by $a^\alpha$ times, according to formula $Q=M \pm N$; converting the resulting digital code Q from the reference signal $Y_1$ to the analog signal $Z_1$, and converting the digital code N from the reference signal $Y_2$ to the analog signal $Z_2$, wherein the reference signals $Y_1$ and $Y_2$ are related by a ratio: $Y_2=Y_1(1 \pm a^{-\alpha})$, wherein a is a base of number system, a is a number of bits of shifting the control code $a^{-\alpha}N$, thereafter performing the above-mentioned step of summing of the converted analog signals $Z_1$ and $Z_2$ to the output signal $Z_0$.

In a preferred embodiment, a conversion scale of the parallel conversions of the analog signals $Z_1$ and $Z_2$ to the output signal $Z_0$ is the same.

In a preferred embodiment, the algebraically summing of the control code M and the control code N in accordance with the formula $Q=M+N$ is performed as an arithmetic summing, and the analog conversion of the output signals $Z_1$ and $Z_2$ is performed by subtracting thereof, wherein the reference signal $Y_2$ is formed in accordance with the expression: $Y_2=Y_1(1-a^{-\alpha})$;

In a preferred embodiment, the algebraically summing the control code M and the control code N, in accordance with the formula $Q=M-N$, is performed as an arithmetic subtraction, and the analog conversion of the output signals $Z_1$ and $Z_2$ is performed by summing thereof, wherein the reference signal $Y_2$ is formed in accordance with the expression: $Y_2=Y_1(1+a^{-\alpha})$.

Advantageous Effects

The technical result is achieved by the proposed method with the above-mentioned differences.

The proposed method is based on a principle of Vernier conversion by use of two dimensional scales in a fractional ratio, i.e. implementation of a pair of conversions $X \Rightarrow Z_1$; $X \Rightarrow Z_2$; $Z_1, Z_2 \Rightarrow Z_0$.

In other words, there is the pair of dimensional scales (reference signals Y) related by a formula: $Y_2=Y_1(1 \pm a^{-\alpha})$, wherein a structure of the control code X is represented in a form (artificial partition): $X=X_{\alpha+\beta}X_{\alpha+\beta-1} \ldots X_2X_1 \equiv M+a^{-\alpha}N$, wherein M is a control word of high-order bits with length $\alpha$ and $a^{-\alpha}N$ is a group of lower-order bits of length $\beta$ of the number X in the selected number system. In practice, the number N is a result of multiplying the number $a^{-\alpha}N$ by $a^\alpha$ times (shifted by $\alpha$ digits to the left), i.e., digitally multiplied $a^\alpha$ times. Consequently: $Q=M\pm N$;

$$Z_1 = Y_1 Q = Y_1 \times \left( \sum_{m=1}^{\alpha} q_m a^{-m} \pm \sum_{n=1}^{\beta} q_n a^{-n} \right);$$

$$Z_2 = Y_2 N = Y_2 \times \sum_{n=1}^{\beta} q_n a^{-n};$$

$$Z_0 = Z_1 \mp Z_2 = Y_1 \left[ \sum_{m=1}^{\alpha} q_m a^{-m} \pm \sum_{n=1}^{\beta} q_n a^{-n} \right] \mp Y_1 (1 \mp a^{-\alpha}) \left[ \sum_{n=1}^{\beta} q_n a^{-n} \right] =$$

$$Y_1 \left\{ \sum_{m=1}^{\alpha} q_m a^{-m} \pm \sum_{n=1}^{\beta} q_n a^{-n} \mp \sum_{n=1}^{\beta} q_n a^{-n} + a^{-\alpha} \sum_{n=1}^{\beta} q_n a^{-n} \right\}.$$

In this case, the following limitation shall be observed:
when arithmetic summing of digital control codes M and N, the signals $Z_1$ and $Z_2$ in the output analog adder shall be subtracted, as well as the second reference signal $Y_2=Y_1(1-a^{-\alpha})$, in accordance with the expression:

$$Z_0 = Z_1 + Z_2 = Y_1 \left[ \sum_{m=1}^{\alpha} q_m a^{-m} - \sum_{n=1}^{\beta} q_n a^{-n} \right] + Y_1 (1 + a^{-\alpha}) \left[ \sum_{n=1}^{\beta} q_n a^{-n} \right] =$$

$$Y_1 \left\{ \sum_{m=1}^{\alpha} q_m a^{-m} + a^{-\alpha} \sum_{n=1}^{\beta} q_n a^{-n} \right\};$$

wherein m=1, 2, ..., $\alpha$; n=1, 2, ..., $\beta$, q=0, 1, ..., a–1.
when arithmetic subtraction of the digital control codes M and N, the signals $Z_1$ and $Z_2$ in the output analog adder shall be added, as well as the second reference signal $Y_2=Y_1(1+a^{-\alpha})$, in accordance with the expression:

$$Z_0 = Z_1 - Z_2 = Y_1 \left[ \sum_{m=1}^{\alpha} q_m a^{-m} + \sum_{n=1}^{\beta} q_n a^{-n} \right] - Y_1 (1 - a^{-\alpha}) \left[ \sum_{n=1}^{\beta} q_n a^{-n} \right] =$$

$$Y_1 \left\{ \sum_{m=1}^{\alpha} q_m a^{-m} + a^{-\alpha} \sum_{n=1}^{\beta} q_n a^{-n} \right\}.$$

As follows from the above formulas, these conversions lead to the same result, providing the required conversion accuracy of the digital control code X to the analog value $Z_0$:

$$Z_0 = Y_1 \{ \sum_{m=1}^{\alpha} q_m a^{-m} + a^{-\alpha} \sum_{n=1}^{\beta} q_n a^{-n} \}.$$

DETAILED DESCRIPTION

Figure 3:
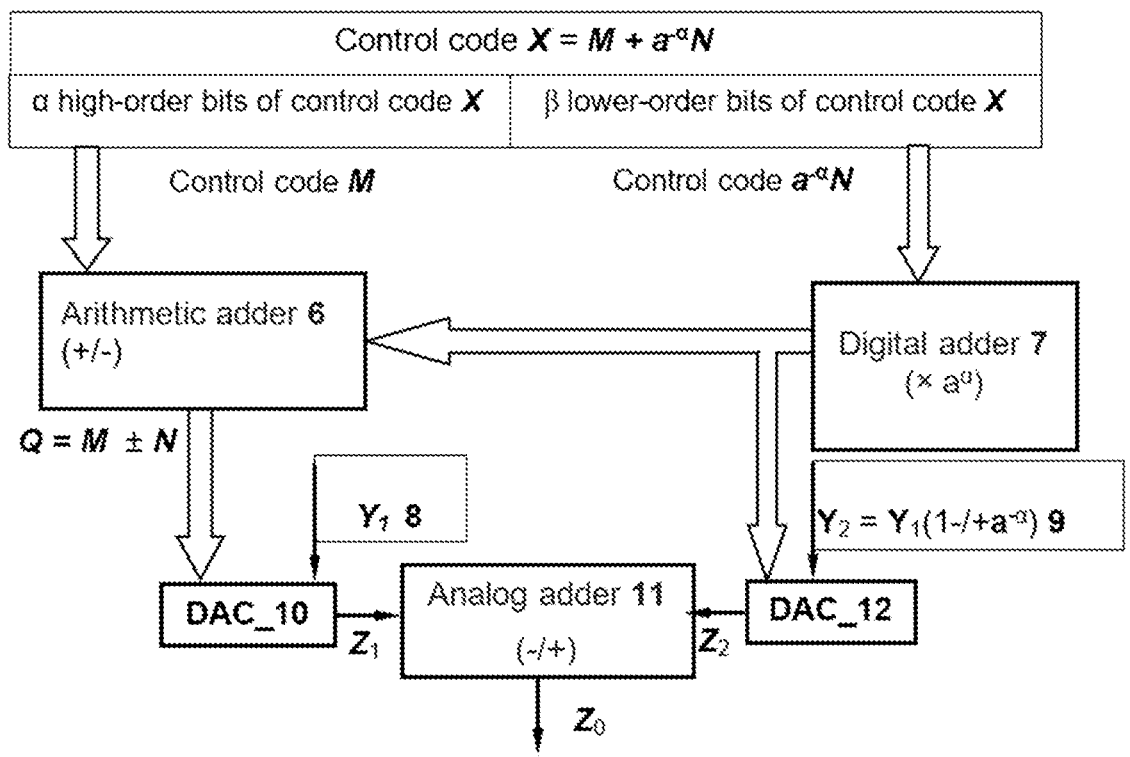
FIG. 3 shows a Vernier digital-to-analog converter and method.

FIG. 3 is a block diagram of one possible embodiment of the proposed method of building a Vernier digital-to-analog converter showing an arithmetic adder 6, to the corresponding inputs of which $\alpha$ of high-order bits and $\beta$ of lower-order bits of the control code X arrive, wherein the lower-order $a^{-\alpha}N$ bits were previously digitally multiplied $a^\alpha$ times (left shift by a bits) using a digital multiplier 7.

FIG. 3 also shows a reference signal $Y_1$ source 8, a reference signal $Y_2$ source 9, a DAC_10, an analog adder 11, and a DAC_12. An output bus of the arithmetic adder 6 is connected to a corresponding input control bus of the DAC_10, and the other input of the DAC_10 is connected to an output of the reference signal $Y_1$ source 8. An output of the DAC_10 is connected to a corresponding input of the analog adder 11, and the other input of the adder 11 is connected to an output of the DAC_12. The $a^{-\alpha}N$ low-order bits of the control code X are fed to a control input bus of the DAC_12, subjected to the digital multiplication $a^\alpha$ times (left shift by $\alpha$ bits) using the digital multiplier 7. The other input of the DAC_12 is connected to the output of the reference signal $Y_2$ source 9. An output analog signal $Z_0$ is obtained at the output of the analog adder 11.

In this embodiment, the proposed method of the Vernier digital-to-analog converter structure operates as follows.

The input buses of the arithmetic adder 6 and of the digital multiplier 7 receive $\alpha$ high-order bits and $\beta$ low-order bits of the control code X, respectively, being the control code M and the control code $a^{-\alpha}N$, respectively. The $\beta$ lower-order bits are multiplied $a^\alpha$ times in the digital multiplier 7 resulting in the control code N, which is fed to the second input bus of the digital arithmetic adder 6 and to the input bus of the DAC_12. The reference signal $Y_2=Y_1(1\pm a^{-\alpha})$ is also fed to the input of the DAC_12, wherein in the arithmetic adder 6, algebraic summation (arithmetic summing with account for the sign) of the $\alpha$ high-order bits and the $\beta$ of lower-order bits of the number X obtained after $a^\alpha$ times $\beta$ multiplication is performed in accordance with formula Q=M N, and the summation result comes to the input control bus of the DAC_10. The reference signal $Y_1$ is also fed to the input of the DAC_10. A digital code Q in the DAC_10 is converted from the reference signal $Y_1$ to the analog signal $Z_1$, and the digital code N in the DAC_12 is converted from the reference signal $Y_2$ to the analog signal $Z_2$.

The analog adder 11 sums the converted analog signals $Z_1$ and $Z_2$, coming to the corresponding inputs of the analog adder 11, resulting in the analog output signal $Z_0$.

As a numerical example, a conversion of a decimal number $X_{(10)} \leftrightarrow (M+10^{-1}N)_{(10)}$ to an abstract analog parameter Z is provided below.

Since the number system is decimal, the two-digit numerical code $X_{(10)}$ is divided into two single-digit ones (M and N) and the reference signals $Y_1$ and $Y_2$ will take the form of: $Y_1=1.0$; $Y_2=1.1 \times Y_1$.

EXAMPLES

There are two characteristic options: for the case $M_1>N$ and for the case $M_2<N$. Let $M_1=8$ and $M_2=3$, and N takes values from 0 to 9. Calculation and conversion steps are set forth in Table 1 and Table 2 provided below.

TABLE 1

| $M_1$ | N | $M_1 - N$ | $Y_1 \times (M1 - N)$ | $Y_2 \times N$ | $Z_0$ |
|---|---|---|---|---|---|
| 8 | 0 | 8 | 8 | 0.0 | 8.0 |
| 8 | 1 | 7 | 7 | 1.1 | 8.1 |
| 8 | 2 | 6 | 6 | 2.2 | 8.2 |
| 8 | 3 | 5 | 5 | 3.3 | 8.3 |

TABLE 1-continued

| $M_1$ | N | $M_1 - N$ | $Y_1 \times (M_1 - N)$ | $Y_2 \times N$ | $Z_0$ |
|---|---|---|---|---|---|
| 8 | 4 | 4 | 4 | 4.4 | 8.4 |
| 8 | 5 | 3 | 3 | 5.5 | 8.5 |
| 8 | 6 | 2 | 2 | 6.6 | 8.6 |
| 8 | 7 | 1 | 1 | 7.7 | 8.7 |
| 8 | 8 | 0 | 0 | 8.8 | 8.8 |
| 8 | 9 | −1 | −1 | 9.9 | 8.9 |

$Y_2 = 1.1 \times Y_1$

TABLE 2

| $M_2$ | N | $M_2 - N$ | $Y_1 \times (M_2 - N)$ | $Y_2 \times N$ | $Z_0$ |
|---|---|---|---|---|---|
| 3 | 0 | 3 | 3 | 0.0 | 3.0 |
| 3 | 1 | 2 | 2 | 1.1 | 3.1 |
| 3 | 2 | 1 | 1 | 2.2 | 3.2 |
| 3 | 3 | 0 | 0 | 3.3 | 3.3 |
| 3 | 4 | −1 | −1 | 4.4 | 3.4 |
| 3 | 5 | −2 | −2 | 5.5 | 3.5 |
| 3 | 6 | −3 | −3 | 6.6 | 3.6 |
| 3 | 7 | −4 | −4 | 7.7 | 3.7 |
| 3 | 8 | −5 | −5 | 8.8 | 3.8 |
| 3 | 9 | −6 | −6 | 9.9 | 3.9 |

$Y_2 = 1.1 \times Y_1$

The only elements that are critical to strict accuracy insurance requirements for nodes of the Vernier DAC (FIG. 3) are the output analog adder 11 and the reference signals $Y_1$ source 8 and $Y_2$ source 9, respectively. However, corresponding implementation problems are not insurmountable, moreover, they are conventional for (high) precision electronics.

So, for example, with a twenty-bit input binary code ($\alpha=\beta=10$) and $Y_1=10V$, the required relative accuracy of the analog adder 11 and of the source 8 of a reference signal is $\delta_a \leq 2^{-20} \approx 10^{-6}$ (absolute accuracy—9.5 mV), which is quite feasible on modern element base.

In case of $Y_2=0.9 \times Y_1$ and of the same numerical parameters, the following results are obtained:

TABLE 3

| M | N | M + N | $Y_1 \times (M + N)$ | $Y_2 \times N$ | $Z_0$ |
|---|---|---|---|---|---|
| 8 | 0 | 8 | 8 | 0.0 | 8.0 |
| 8 | 1 | 9 | 9 | 0.9 | 8.1 |
| 8 | 2 | 10 | 10 | 1.8 | 8.2 |
| 8 | 3 | 11 | 11 | 2.7 | 8.3 |
| 8 | 4 | 12 | 12 | 3.6 | 8.4 |
| 8 | 5 | 13 | 13 | 4.5 | 8.5 |
| 8 | 6 | 14 | 14 | 5.4 | 8.6 |
| 8 | 7 | 15 | 15 | 6.3 | 8.7 |
| 8 | 8 | 16 | 16 | 7.2 | 8.9 |
| 8 | 9 | 17 | 17 | 8.1 | 8.9 |

$Y_2 = 0.9 \times Y_1$

TABLE 4

| M | N | M + N | $Y_1 \times (M + N)$ | $Y_2 \times N$ | $Z_0$ |
|---|---|---|---|---|---|
| 3 | 0 | 3 | 3 | 0.0 | 3.0 |
| 3 | 1 | 4 | 4 | 0.9 | 3.1 |
| 3 | 2 | 5 | 5 | 1.8 | 3.2 |
| 3 | 3 | 6 | 6 | 2.7 | 3.3 |
| 3 | 4 | 7 | 7 | 3.6 | 3.4 |
| 3 | 5 | 8 | 8 | 4.5 | 3.5 |
| 3 | 6 | 9 | 9 | 5.4 | 3.6 |

TABLE 4-continued

| M | N | M + N | $Y_1 \times (M + N)$ | $Y_2 \times N$ | $Z_0$ |
|---|---|---|---|---|---|
| 3 | 7 | 10 | 10 | 6.3 | 3.7 |
| 3 | 8 | 11 | 11 | 7.2 | 3.8 |
| 3 | 9 | 12 | 12 | 8.1 | 3.9 |

$Y_2 = 0.9 \times Y_1$

It should also be noted that in both of the above-mentioned cases, a digit capacity of the first DAC_10 should be greater by one than the digit capacity of the second DAC_12, in other words, with the equal digit capacity of the DAC_10 and the DAC_12 a length $\beta$ of the control code N and of the code $X_{02}=N-1$. As a result, when using the two DACs of equal digit capacity $\beta$ (and the accuracy $a^{-1}$), the resulting accuracy will not be better than $\delta \geq (\beta-1)^{-1}$, which, in general, is not so bad as it seems.

Table 5 shows the results of selective checking of the first conversion algorithm for a four-digit decimal number.

TABLE 5

$Y_2 = 1.01 \times Y_1$

| $X_1$ | $X_2$ | $X_3$ | $X_4$ | $Q_1 = X_1 X_2 - X_3 X_4$ | $Z_1 = Y_1 \times X_1 X_2$ | $Z_2 = Y_2 \times X_3 X_4$ | $Z_0 = Z_1 + Z_2$ |
|---|---|---|---|---|---|---|---|
| 8 | 0 | 0 | 0 | 80 | 80 | 0.00 | 80.00 |
| 8 | 1 | 0 | 2 | 79 | 79 | 2.02 | 81.02 |
| 8 | 2 | 0 | 4 | 78 | 78 | 4.04 | 82.04 |
| 8 | 3 | 0 | 1 | 82 | 82 | 1.01 | 83.01 |
| 8 | 4 | 0 | 3 | 81 | 81 | 3.03 | 84.03 |
| 8 | 5 | 0 | 6 | 79 | 79 | 6.06 | 85.06 |
| 8 | 6 | 0 | 8 | 78 | 78 | 8.08 | 86.08 |
| 8 | 7 | 0 | 5 | 82 | 82 | 5.05 | 87.05 |
| 8 | 8 | 0 | 7 | 81 | 81 | 7.07 | 88.07 |
| 8 | 9 | 0 | 9 | 80 | 80 | 9.09 | 89.09 |
| 8 | 3 | 4 | 7 | 36 | 36 | 47.47 | 83.47 |
| 8 | 3 | 1 | 6 | 67 | 67 | 16.16 | 83.16 |
| 8 | 3 | 2 | 6 | 57 | 57 | 26.26 | 83.26 |
| 8 | 3 | 3 | 6 | 47 | 47 | 36.36 | 83.36 |
| 8 | 3 | 4 | 6 | 37 | 37 | 46.46 | 83.46 |
| 8 | 3 | 5 | 6 | 27 | 27 | 56.56 | 83.56 |
| 8 | 3 | 6 | 6 | 17 | 17 | 66.66 | 83.66 |
| 8 | 3 | 7 | 6 | 7 | 7 | 76.76 | 83.76 |
| 8 | 3 | 8 | 6 | −3 | −3 | 86.86 | 83.86 |
| 8 | 3 | 9 | 6 | −13 | −13 | 96.96 | 83.96 |

The last question is the unequal digit capacity of N and M for (N+M)=1 (mod 2), i.e., for X odd, namely, the case M=N−1. The following tables 6 and 7 show further results of the first and second conversions.

TABLE 6

| $X_1$ | $X_2$ | $X_3$ | $Q_1 = X_1 - X_2 X_3$ | $Z_1 = Y_1 \times Q_1$ | $Z_2 = Y_2 \times Q_2$ | $Z_0 = Z_1 + Z_2$ |
|---|---|---|---|---|---|---|
| 8 | 0 | 0 | 8 | 8 | 0.00 | 8.00 |
| 8 | 0 | 1 | 7 | 7 | 1.01 | 8.01 |
| 8 | 1 | 2 | −4 | −4 | 12.12 | 8.12 |
| 8 | 1 | 3 | −5 | −5 | 13.13 | 8.13 |
| 8 | 2 | 4 | −16 | −16 | 24.24 | 8.24 |
| 8 | 2 | 5 | −17 | −17 | 25.25 | 8.25 |
| 8 | 3 | 6 | −28 | −28 | 36.36 | 8.36 |
| 8 | 3 | 7 | −29 | −29 | 37.37 | 8.37 |
| 8 | 4 | 8 | −40 | −40 | 48.48 | 8.48 |
| 8 | 4 | 9 | −41 | −41 | 49.49 | 8.49 |
| | | | | | | etc |

TABLE 7

| $X_1$ | $X_2$ | $X_3$ | $Q_1 = X_1 + X_2X_3$ | $Z_1 = Y_1 \times Q_1$ | $Z_2 = Y_2 \times Q_2$ $(Q_2 = X_2X_3)$ | $Z_3 = Z_1 - Z_2$ |
|---|---|---|---|---|---|---|
| 3 | 0 | 0 | 3 | 3 | 00.00 | 3.00 |
| 3 | 0 | 1 | 4 | 4 | 00.99 | 3.01 |
| 3 | 1 | 2 | 15 | 15 | 11.88 | 3.12 |
| 3 | 1 | 3 | 16 | 16 | 12.87 | 3.13 |
| 3 | 2 | 4 | 27 | 27 | 23.76 | 3.24 |
| 3 | 2 | 5 | 28 | 28 | 24.75 | 3.25 |
| 3 | 3 | 6 | 39 | 39 | 35.64 | 3.36 |
| 3 | 3 | 7 | 40 | 40 | 36.63 | 3.37 |
| 3 | 4 | 8 | 51 | 51 | 47.52 | 3.48 |
| 3 | 4 | 9 | 52 | 52 | 48.51 | 3.49 |

The proposed conversion method with any ratio of the numbers N and M, concedes only one bit loss and provides an increasing of the digital-to-analog conversion accuracy by $\approx a^{\alpha-1}$ times, because a errors are significantly reduced, which means that a parallel digital-to-analog conversion accuracy increases without tightening the requirements for the manufacturing technology of DAC elements.

The attention shall be drawn again to the following: for any digital-to-analog conversion method (double or more integration, sigma-delta, conveyor, sequential approximation, Vernier, etc.), the accuracy requirements for analog nodes are determined only by the required conversion accuracy.

The weight contribution of individual analog elements of the digital-to-analog converter implementing the proposed method to the budget of permissible errors of a whole device depends on a specific circuitry implementation. Certainly, a well-known rule is also applied: the stricter are the conversion accuracy requirements, the stricter (at least linearly) are the analog node requirements.

The requirements for accuracy and stability of sources of reference voltages (currents) and analog algebraic adders of input/output voltages (currents) are invariant to the selected conversion method, and their contribution is small.

The main contribution to the errors makes a DAC itself, (explicitly or implicitly) presenting in a structure of Vernier digital-to-analog conversion, due to errors of current/voltage switches and R(C) matrices.

Using identical resistors allows significant accuracy improvement in comparison with a conventional weighting DAC because a set of precision elements with identical parameters is relatively easy to produce. A DAC of R-2R type allows to reduce, but not to remove, the restrictions on digit capacity. With a laser adjustment of film resistors arranged on same substrate of the hybrid IC, a DAC accuracy of 20-22 bits can be achieved.

Therefore, in practice important is to abate the requirements for the DAC (by reducing of required number $\psi$ of the control code X bits) along with maintaining final conversion accuracy.

Exemplary elements realizing the proposed conversion method shown in the block diagram are as follows.

The arithmetic adder 6 can be implemented on the integrated circuits of the arithmetic adder К 555 ИМ3 (SN7483) or on the integrated circuits of the arithmetic device КР 1533 ИП3 П3.

An integrated circuit of double DAC AD5763 can be used as the DAC 10 and 12.

The reference signals sources 8 and 9 can be provided on integrated circuits LT6657 (precision voltage source) or LT3092 (precision current source).

Integrated circuits of the shift registers—universal registers ИР 1533 КР 8 (SN74HC164) can be used for digital multiplying the N lower-order bits of the control code X by $\alpha$ times (left shift by a bits).

The invention claimed is:

1. A method of Vernier digital-to-analog conversion, the method comprising:

performing a conversion of a reference signal Y using a control code $X=M+a^{-\alpha}N$ with a length $\psi=\alpha+\beta$, wherein M is a control code with a length $\alpha$, including high-order bits of the control code X, and $a^{-\alpha}N$ is a control code with a length $\beta$, including lower-order bits of the control code X, wherein $a \approx \beta$;

performing digital multiplication of the lower-order $a^{-\alpha}N$ bits of the control code X by $a^{\alpha}$ times algebraic summing $\alpha$ of the high-order bits of the control code X and $\beta$ of the lower-order bits of $a^{-\alpha}N$ of the control code X being a result of multiplication by $a^{\alpha}$ times, according to formula $Q=M\pm N$, wherein N is a resulting digital code of the digital multiplication, and Q is a resulting digital code of $M\pm N$;

converting the resulting digital code Q from a reference signal $Y_1$ to an analog signal $Z_1$, and converting the resulting digital code N from a reference signal $Y_2$ to an analog signal $Z_2$, wherein reference signals $Y_1$ and $Y_2$ are related by a ratio: $Y_2=Y_1(1\pm a^-)$, wherein a is a base of number system, $\alpha$ is a number of bits of shifting the control code $a^{-\alpha}N$; and summing analog signals $Z_1$ and $Z_2$ to generate an analog output signal $Z_0$.

2. The method according to claim 1, wherein algebraic summing of the control code M and the resulting digital code N to a formula $Q=M-N$ is an arithmetic summing thereof, and conversion of the analog signals $Z_1$ and $Z_2$ is performed by subtracting thereof, wherein the reference signal $Y_2$ is generated in accordance with an expression: $Y_2=Y_1(1-a^{-\alpha})$.

3. The method according to claim 1, wherein algebraic summing the control code M and the resulting digital code N according to a formula $Q=M-N$ is an arithmetic subtraction thereof, and conversion of the analog signals $Z_1$ and $Z_2$ is performed by summing thereof, wherein the reference signal $Y_2$ is generated in accordance with an expression: $Y_2=Y_1(1+a^{-\alpha})$.

* * * * *

UNITED STATES PATENT AND TRADEMARK OFFICE
CERTIFICATE OF CORRECTION

| | | |
|---|---|---|
| PATENT NO. | : 11,689,212 B2 | |
| APPLICATION NO. | : 17/439607 | |
| DATED | : June 27, 2023 | |
| INVENTOR(S) | : Yury Alexandrovich Nikitin | |

It is certified that error appears in the above-identified patent and that said Letters Patent is hereby corrected as shown below:

On the Title Page

Item (57), IN THE ABSTRACT:

Column 2, Line 3:
New reads: "X = M + α⁻ᵅN"
Should read: -- X = M + a⁻ᵅN --

Column 2, Line 5:
New reads: "α⁻ᵅN"
Should read: -- a⁻ᵅN --

In the Specification

Column 1, Line 64:
Now reads: "$0 \leq X = \Sigma_{k=0}^{\psi-1} q_k \times a^{-k} < 1$"
Should read: -- $0 \leq X = \sum_{k=0}^{\psi-1} q_k \times a^{-k} < 1$ --

Column 2, Line 12:
Now reads: "$0 \leq X = \Sigma_{k=0}^{\psi-1} q_k \times a^{-k} < 1$"
Should read: -- $0 \leq X = \sum_{k=0}^{\psi-1} q_k \times a^{-k} < 1$ --

Column 3, Line 10:
Now reads: "ψ=α+β, where a is a number"
Should read: -- ψ=α+β, where α is a number --

Column 3, Line 17:
Now reads: "are multiplied aa times"

Signed and Sealed this
Thirteenth Day of August, 2024

*Katherine Kelly Vidal*

Katherine Kelly Vidal
*Director of the United States Patent and Trademark Office*

Should read: -- are multiplied $a^\alpha$ times --

Column 4, Line 29:
Now reads: "a is a number of bits"
Should read: -- $\alpha$ is a number of bits --

Column 4, Line 63:
Now reads: "$X = X_{\alpha+\beta}X_{\alpha+\beta-1} ... X_2X_1 \equiv M + a^{-\infty}N$"
Should read: -- $X = X_{\alpha+\beta}X_{\alpha+\beta-1} ... X_2X_1 \equiv M + a^{-\alpha}N$ --

Column 5, Line 1:
Now reads: "shifted by $\underline{a}$ digits"
Should read: -- shifted by $\alpha$ digits --

Column 5, Line 50:
Now reads: "$Z_0 = Y_1\{\Sigma_{m=1}^{\alpha} q_m a^{-m} + a^{-\alpha} \Sigma_{n=1}^{\beta} q_n a^{-n}\}$"
Should read: -- $Z_0 = Y_1\left\{\sum_{m=1}^{\alpha} q_m a^{-m} + a^{-\alpha} \sum_{n=1}^{\beta} q_n a^{-n}\right\}$ --

Column 5, Line 56:
Now reads: "from the prior art:"
Should read: -- from the prior art; --

Figure 1:
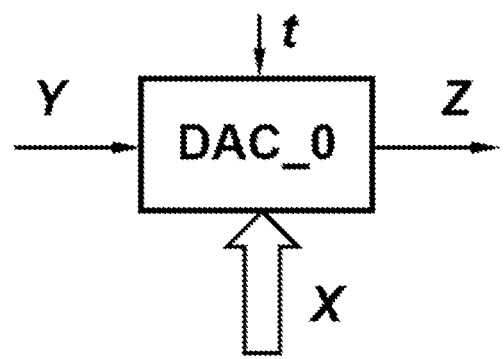
Fig. 1 shows a digital-to-analog converter (DAC) known from the prior art.
Figure 2:
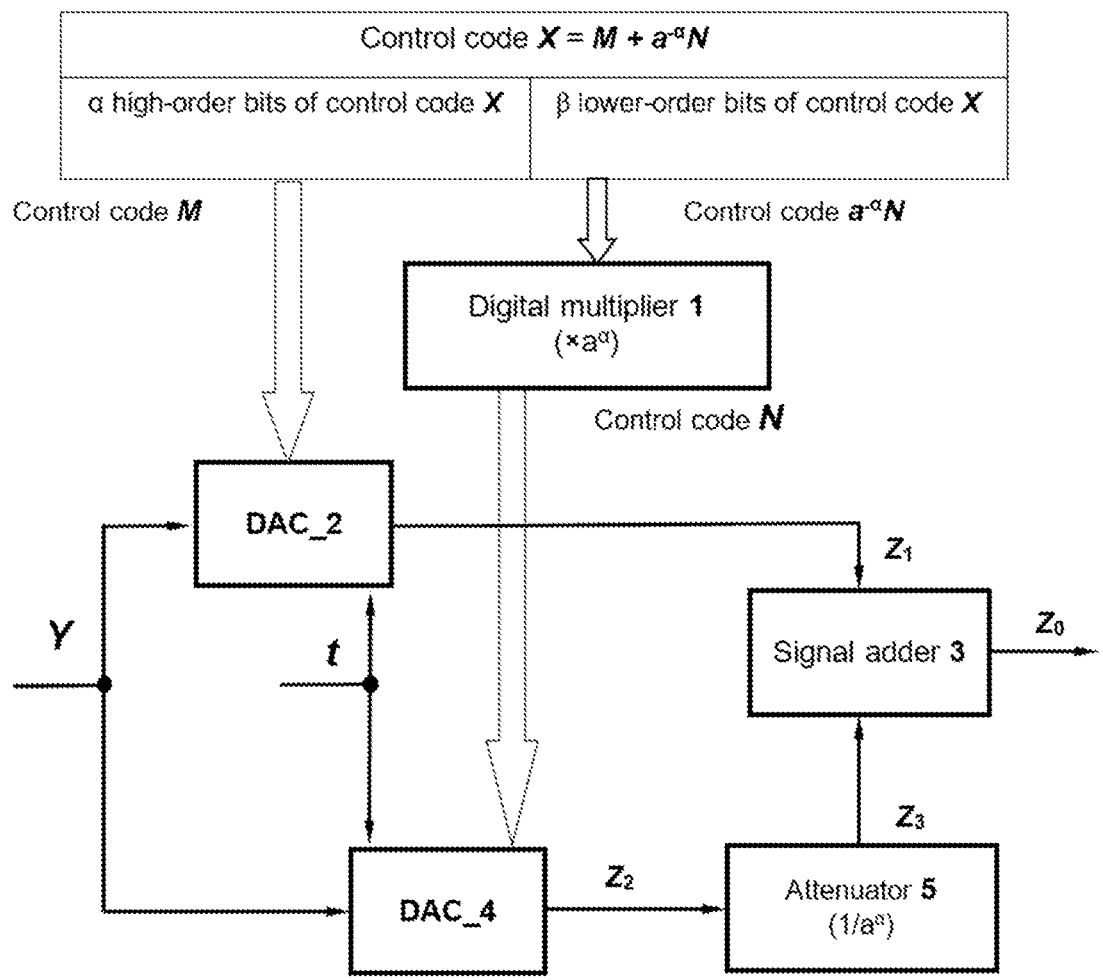
FIG. 2 shows a parallel digital-to-analog converter and method using the DAC as shown in FIG. 1. known from the prior art.

Column 5, Lines 57-58:
Now reads: "FIG. 1. known from the prior art: and"
Should read: -- FIG. 1, known from the prior art; and --

Column 6, Line 4:
Now reads: "left shift by a bits"
Should read: -- left shift by $\alpha$ bits --

Column 6, Line 35:
Now reads: "Q = M N"
Should read: -- Q = M + N --

Column 8, Line 49:
Now reads: "(N + M) = 1"
Should read: -- (N + M) $\equiv$ 1 --

Column 8, Line 66:
Should read: -- $Y_2 = 1.01 \times Y_1$ --

Column 9, Line 14:
Should read: -- $Y_2 = 0.99 \times Y_1$ --

CERTIFICATE OF CORRECTION (continued)
U.S. Pat. No. 11,689,212 B2

Column 10, Line 5:
Now reads: "КР$_{1533}$ИП3$_{П3}$"
Should read: -- КР$_{1533}$ИП3 --

Column 10, Line 12:
Now reads: "ИР$_{1533}$КР$_8$"
Should read: -- КР$_{1533}$ИР$_8$ --

Column 10, Line 14:
Now reads: "left shift by a bits"
Should read: -- left shift by α bits --

In the Claims

Claim 1, Column 10, Line 24:
Now reads: "a ≈ β"
Should read: -- α ≈ β --

Claim 1, Column 10, Line 37:
Now reads: "Y$_2$ = Y$_1$ (1 ± a$^-$)"
Should read: -- Y$_2$ = Y$_1$ (1 ± a$^{-α}$) --

Claim 2, Column 10, Line 44:
Now reads: "N to a formula Q = M − N"
Should read: -- N according to a formula Q = M + N --